United States Patent [19]

Khan et al.

[11] Patent Number: 5,047,091

[45] Date of Patent: Sep. 10, 1991

[54] NICKEL BASED MONOCRYSTALLINE SUPERALLOY, METHOD OF HEAT TREATING SAID ALLOY, AND PARTS MADE THEREFROM

[75] Inventors: Tasadduq Khan, Jouy en Josas; Pierre Caron, Les Ulis, both of France

[73] Assignee: Office National d'Etudes et de Recherche Aerospatiales, Chatillon, France

[21] Appl. No.: 393,033

[22] Filed: Aug. 10, 1989

Related U.S. Application Data

[63] Continuation of Ser. No. 363,285, Mar. 29, 1982, abandoned.

[30] Foreign Application Priority Data

Apr. 3, 1981 [FR] France .................. 81 06782

[51] Int. Cl.$^5$ .................................. C22F 1/10
[52] U.S. Cl. .................... 148/3; 148/13.1; 148/162; 148/404; 148/410
[58] Field of Search ............ 148/404, 410, 428, 162, 148/13.1, 3; 420/448, 450

[56] References Cited

U.S. PATENT DOCUMENTS 4,371,404  2/1983  Duhl et al. .................. 148/162
4,582,548  4/1986  Harris et al. .................. 148/3

Primary Examiner—R. Dean
Assistant Examiner—Margery S. Phipps
Attorney, Agent, or Firm—Herbert Dubno

[57] ABSTRACT

A monocrystalline superalloy with a nickel based matrix and particularly intended for the manufacture of turbine blades, has the following composition, by weight: Al=5.4% to 6.2%; Co=4% to 7%; Cr=6% to 9%; Mo=0% to 2.5%; Ta=5.5% to 8%; Ti=0% to 1%; W=7% to 9%; and Ni=balance to 100%.

The invention also provides a method of improving the alloy's resistance to creep, in which the $Ni_3Al$ type $\gamma'$ phase is put completely into solution at a first temperature, and then the $\gamma'$ phase is precipitated into the $\gamma$ solid solution at a temperature greater than 1000° C. This treatment considerably increases the alloy's resistance to creep over a wide range of temperatures.

17 Claims, 1 Drawing Sheet

NICKEL BASED MONOCRYSTALLINE SUPERALLOY, METHOD OF HEAT TREATING SAID ALLOY, AND PARTS MADE THEREFROM

This is a continuation of co-pending application Ser. No. 06/363,285 filed on 29 Mar. 1982, now abandoned.

The present invention relates to monocrystalline superalloys with a nickel-based matrix and for use in particular in the manufacture of both the fixed and the moving blades of aeroengine turbines.

BACKGROUND OF THE INVENTION

Much work has been done over the past few years in devising specific alloy compositions, either for superalloys with columnar grains, or else for superalloys of a monocrystalline structure.

In comparision with superalloys of similar composition and equiaxial grains, superalloys with columnar grains obtained by directed solidification have greater mechanical strength in respect of forces applied in the direction of the joint planes between the grains, but in respect of transverse forces their mechanical strength is no better.

The development of monocrystalline superalloys (in particular the alloy known as MAR-M200) was an important step forward in increasing strength in respect of forces applied transversally to the direction of solidification. But a comparable improvement could also be obtained in columnar grain superalloys by introducing hafnium in their composition, which for a time lead to much less work being done on monocrystalline solidification.

Interest in monocrystalline solidification has recently increased again, but for alloys of relatively simple composition, in particular without the addition of carbon, boron or zirconium. These elements were previously included in the composition both of monocrystalline alloys and of columnar grain alloys for the purpose of hardening the joints between the grains (at least in columnar grain alloys) to avoid premature breakage due to creep.

The said elements now avoided contribute to the formation of low melting point regions, particularly in the spaces between dendrites as they form during solidification. Avoiding said elements results in a notable increase in the incipient melting point of the alloy, and thus makes it possible to consider using very high temperature heat treatment, particularly for nickel based alloys, in order to ensure that the $\gamma'$ (gamma prime) phase of the Ni$_3$ (Al, Ti . . . ) type is completely in solution.

Alloys have been obtained in this way which can be heated to a high enough temperature to ensure that the $\gamma'$ phase is completely in solution, and then to obtain controlled precipitation thereof up to a very large proportion, 60% or more, of the total volume.

Further, the size of the precipitated grains constitutes another significant factor governing the alloy's resistance to creep: for a nickel based superalloy having 60% or more of its volume in the form of $\gamma'$ precipitate, the optimum $\gamma'$ precipitate grain size for maximum resistance to creep is generally about 3000 Å (ångström units). However, to obtain $\gamma'$ precipitate grains that do not exceed 3000 Å in size, the precipitation temperature must be less than a fixed limit temperature.

One aim of the invention is to provide a composition for nickel based monocrystalline superalloys whose resistance to creep over a wide range of temperatures can be greatly increased by heat treatment.

Another aim of the invention is to provide a method of heat treatment which is particularly applicable to monocrystalline superalloys of such composition, to confer thereto an exceptionally high resistance to creep over a wide range of temperatures.

SUMMARY OF THE INVENTION

The present invention provides a monocrystalline superalloy composition comprising the following elements in the following proportions by weight:

| | |
|---|---|
| Al 5.4% to 6.2% | Co 4% to 7% |
| Cr 6% to 9% | Mo 0% to 2.5% |
| Ta 5.5% to 8% | Ti 0% to 1% |
| W 7% to 9% | Ni balance to 100%. |

Developing alloy compositions of this type is not at all straight forward because of the near impossibility of accurately predicting the effects of changing the proportion of a previously used element, of avoiding it altogether, or of adding a new element. However, some general comments can be made:

Cobalt

Generally speaking cobalt is introduced in superalloys to reduce the stacking fault energy in the matrix, and consequently to increase resistance to creep. However, it is generally desireable to reduce the level of cobalt or to avoid it all together, firstly on account of its price, and secondly to avoid the formation of the topologically closed packed (T.C.P.) phases (sigma, mu, Laves) which are well known by metallurgists to be due to the presence of cobalt. This is complicated by the fact that these phases also appear at medium temperatures in some cobalt-free alloys, in which cases the addition of a few per cent cobalt prevents the formation thereof.

Alloys in accordance with the present invention include cobalt and therefore benefit from the advantages due thereto, but they do not give rise to the formation of said harmful phases, even when held at high temperatures over long periods of time.

Tungsten

It is particularly advantageous to have at least 7% tungsten. Firstly it enables the matrix to harden in solid solution, and secondly sufficient quantities of tungsten enter into the $\gamma'$ phase to make it more stable at high temperatures than the $\gamma'$ phase of conventional superalloys. Although the proportion of tungsten is high, it does not lead to the formation of sigma or mu type phases, when *molybdenum* is present.

In alloys in accordance with the invention, *carbon, boron*, and *zirconium* are present in proportions of less than 80 ppm (parts per million), 50 ppm, and 100 ppm respectively. In other words well below the amounts that could lead to the incipient melting temperature of the alloy being lowered. In conventional alloys these elements are usually present in the following proportions: carbon 1000 ppm to 1500 ppm; boron 100 ppm to 200 ppm; and zirconium 300 ppm to 1000 ppm.

These alloys may be subjected to heat treatments leading to a very great and unexpected improvement in their resistance to creep over a large temperature range, i.e. 700° C. to 1100° C., whereas up to now distinctly smaller improvements were obtained only for temperatures below 1000° C.

In accordance with the invention, the qualities, in particular resistance to creep, of parts made from superalloys of the above-defined composition are notably increased by precipitating a γ' phase of the Ni₃Al type (after said phase has been put completely into solution in the γ solid solution) by raising said part to a temperature of more than 1000° C., and preferably to a temperature in the range 1020° C. to 1120° C., followed by cooling. The γ' phase precipitation temperature is maintained for several hours to several tens of hours, depending on the temperature chosen.

In accordance with the invention, the part may be subjected to additional heat treatment after being brought to more than 1000° C. for γ' phase precipitation. The additional heat treatment serves to increase the proportion by volume of the γ' phase precipitate, and is carried out at a temperature of about 850° C.

The various cooling stages required by the invention may take place in air, down to ambient temperature, or else in a furnace, with the part being taken directly from the temperature of an earlier heat treatment (for putting the γ' phase into solution or for precipitating it) to the temperature of a subsequent heat treatment.

Since the best creep performance for superalloys of the type considered here is generally obtained by precipitating the γ' phase at temperatures in the range 800° to 980° C., thereby precipitating grains that are about 3000 Å in size, the alloys' resistance to creep ought to be reduced if γ' phase grains are precipitated at temperatures of more than 1000° C. which give rise, as is known, to grains of larger sizes.

However, although applying such higher temperature heat treatment to a superalloy in accordance with the invention does lead to the precipitation of grains larger than 3000 Å in size (up to about 5000 Å), nonetheless the surprising result is obtained of considerably improved creep performance for use in the range 700° C. to 1100° C. The alloy lifetime may thereby be increased by a factor of 2 to 3.

Further, after getting the γ' phase into solution at very high temperatures, precipitation heat treatment at a high temperature in the range 1020° to 1120° C. facilitates simultaneous surface-protecting treatment at said high temperature. Such surface-protecting treatment, e.g. aluminization, is desireable for superalloys and its simultaneous application does not reduce the mechanical properties of the finally obtained alloy.

Alloys in accordance with the invention are solidified in monocrystalline form growing along the <001> crystallographic direction in solidifying apparatus having a steep thermal gradient (100° C. to 250° C./cm), for example such as that used for directional solidification of superalloys of the type with metal monocarbide reinforcing fibres, as described in U.S. Pat. Nos. 3,871,835 and 4,715,609 in the name of O.N.E.R.A. The monocrystalline alloy is obtained either from a monocrystalline seed, or else by adding grain selector means in the lower part of the apparatus suitable for ensuring that only one grain oriented in the <001> crystallographic direction is obtained at the output from said means. The temperature of the liquid metal medium is about 1650° C., and solidification takes place along a solidification front which moves at between 10 and 40 cm/h.

Monocrystalline alloys in accordance with the invention may also be obtained by using the exothermal process described by L. Sink, G. S. Hoppin III and M. Fujii, in NASA CR 159 464, dated January 1979.

The resulting monocrystalline alloy is then subjected to heat treatment for about 30 minutes at between 1305° C. and 1325° C. depending on the precise composition chosen to put the γ' phase completely into solution. The alloy is then cooled in air to ambient temperature.

The alloy is then subjected to treatment to precipitate the γ' phase. In accordance with the invention, this precipitation treatment takes place at a temperature of between 1020° C. and 1120° C., and generally lasts for several hours. For treatment at 1020° C. the average grain size is about 3000 Å, while for treatment at 1050° C. or more, the grain size is about 5000 Å. In both cases the resulting precipitate is aligned along a well defined crystallographic direction.

BRIEF DESCRIPTION OF THE DRAWINGS

Two examples of the invention are described by way of example with reference to the accompanying drawings, in which.

MORE DETAILED DESCRIPTION

Figure 1:
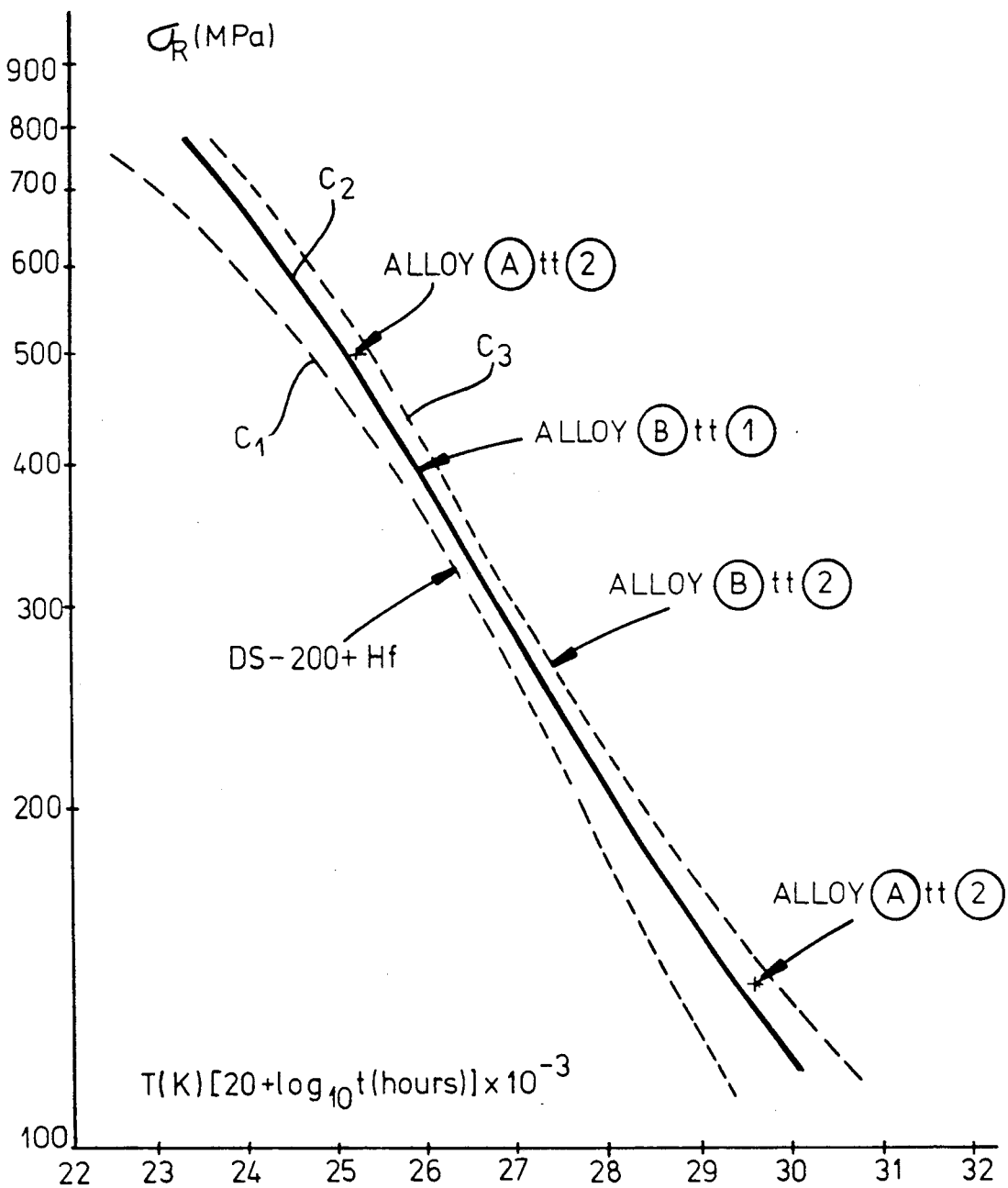
FIG. 1 is a graph showing the variation of the Larson-Miller parameter P as a function of stress.

In the following examples, the alloys were subjected, by way of comparison, to γ' phase precipitating heat treatment lasting several hours and using a maximium temperature lying between 850° C. and 980° C. The precipitated γ' phase grains had an average size of 3000 Å, but were not aligned with any particular lattice direction.

EXAMPLE 1

A monocrystalline alloy (sometimes referred to hereinafter as "alloy A") was made having the following composition by weight:

| | |
|---|---|
| Co 5% | Al 6.1% |
| Cr 8% | Ta 6% |
| Mo 0.5% | Ni balance to 100% |
| W 8% | |

The alloy was made using directed solidification, with the solidification front moving at 15 cm/hour.

The density of the resulting alloy was about 8.54 g/cm³.

Its incipient melting temperature was 1321°±3° C.

Two test pieces were made from the alloy, one of which was subjected to a first heat treatment, and the other of which to a second heat treatment, both defined below, and the heat treated test pieces were then subjected to creep tests.

First Heat Treatment

In a first stage, the test piece was heated to 1315° C. for 30 minutes and then cooled in air.

In a second stage it was heated to 950° C. for 5 hours and then cooled in air.

In a third stage it was heated to 850° C. for 48 hours.

γ' phase precipitation was observed with an average grain size of 3000 Å.

Second Heat Treatment

In a first stage, the test piece was heated to 1315° C. and held at this temperature for 30 minutes. It was then cooled in air.

In a second stage it was heated to 1050° C. for 16 hours and then cooled in air.

In a third stage it was heated to 850° C. for 48 hours.

At the end of the treatment, γ' phase precipitation was observed with an average grain size of 5000 Å. The grains were aligned with the <001> crystallographic direction.

Creep tests were then performed on the two test pieces, i.e. after they had been subjected to the first and second heat treatments respectively. The same tests were also performed on a test piece of a superalloy with columnar grains known as DS200+Hf.

The results of these tests appear in the following Table 1.

-continued

| W 8% | Ni balance to 100% |
|---|---|

The alloy was made using directed solidification, with the solidification front moving at 15 cm/hour.

The density of alloy B was 8.59 g/cm³, and its incipient melting temperature was 1328°±3° C.

Test pieces of alloy B were subjected to the above described first and second heat treatments. After the first treatment the average grain size of the γ' phase precipitate was observed to be about 3000 Å. After the

TABLE 1

| Temperature (°C.) | Stress (MPa) | Creep time t (hours) | DS200 + Hf Alloy | Alloy A (monocrystalline) | |
|---|---|---|---|---|---|
| | | | | 1st heat treatment 1315° C./30 min + 980° C./5 h + 850° C./48 h | 2nd heat treatment 1315° C./30 min + 1050° C./16 h + 850° C./48 h |
| 850 | 500 | t for 1% deformation | 40 h | 20 hours | 42 hours |
| | | t to breakage | 100 h | 124 hours | 252 hours |
| 1050 | 140 | t for 1% deformation | 15 h | 60 hours | 86 hours |
| | | t to breakage | 40 h | 112 hours | 200 hours |

From the creep tests performed, it can be seen that alloy A after heat treatment in accordance with the invention (second heat treatment) lasts for 2.5 times as long at 850° C. than does the DS200+Hf alloy with columnar grains. At 1050° C. and at a stress of 140 MPa, alloy A lasts for 5 times as long as alloy DS200+Hf.

These results were obtained even though alloy A in accordance with the invention does not include any titanium, whereas it was previously generally held that superalloys for manufacturing turbine blades with very high resistance to creep (such as that shown by alloy A) required 1% to 4% by weight titanium to obtain the desired qualities: the presence of titanium serving to reduce the stacking fault energy in the γ' precipitate, and thus leading to improved resistance to creep.

Alloy A thus presents exceptional resistance to creep at high temperatures, while avoiding the drawbacks associated with the presence of titanium, namely: high reactivity with the materials constituting industrial crucibles in which the alloys are made; and, in use, reduced resistance to oxidation and corrosion.

EXAMPLE 2

A monocrystalline alloy (sometimes referred to hereinafter as "alloy B") was made having the following composition by weight:

| Co 5% | Al 5.5% |
|---|---|
| Cr 8% | Ti 1% |
| Mo 0.5% | Ta 6% | second heat treatment the grain size was about 5000 Å.

It was also observed, as for alloy A, that the grains of γ' precipitate of alloy B after the first heat treatment were not aligned, whereas the grains of γ' precipitate of alloy B after the second heat treatment were aligned along a <001> crystallographic direction.

The alloy B test pieces were subjected to creep tests and the results appear in Table 2 below, together with comparable results for DS200+Hf alloy with columnar grains.

TABLE 2

| Temperature (°C.) | Stress (MPa) | Creep time t (hours) | DS200 + Hf Alloy | Alloy B (monocrystalline) | |
|---|---|---|---|---|---|
| | | | | 1st heat treatment | 2nd heat treatment |
| 760 | 750 | t for 1% deformation | 10 h | 48 hours | 110 hours |
| | | t to breakage | 60 h | 450 to 500 hours | 1000 hours |
| 950 | 240 | t for 1% deformation | 45 h | 105 hours | 150 hours |
| | | t to breakage | 170 h | 310 hours | 450 hours |
| 1050 | 120 | t for 1% deformation | 32 h | 330 hours | 700 to 800 hours |
| | | t to breakage | 100 h | 470 hours | 1000 to 1200 hours |

The results that appear from Table 2 likewise show a considerable increase in resistance to creep over the temperature range 760° C. to 1050° C. provided by the heat treatment in accordance with the invention (the second heat treatment).

Up to now, so large an increase in lifetime over such a wide range of temperatures has not been announced for superalloys of this type.

Further, after creep tests at various temperatures in the range 760° C. to 1050° C. had been performed on various test pieces made from alloys in accordance with the invention and/or subjected to the heat treatment in accordance with the invention, the pieces were tested for the presence of T.C.P. phases known as sigma, mu and Laves phases. None were found. Alloys treated in accordance with the invention thus have a high degree of thermal stability over their various operating conditions.

FIG. 1 is a graph showing the variation of the Larson-Miller parameter P as a function of stress $\sigma_R$ (in MPa), where:

$P = T(K)[20 + \log_{10} t(h)] \times 10^{-3}$

Curve $C_1$ relates to the columnar grain alloy known as DS200+Hf.

Curve $C_2$ relates to alloy B subjected to the first heat treatment.

Curve $C_3$ relates to alloy B subjected to the second heat treatment (the heat treatment in accordance with the invention).

These curves confirm the results shown in Table 2: the second heat treatment provides a notable increase in the resistance to creep of alloy B.

Tests have also been made on pieces of alloy A and subjected to the second heat treatment. The corresponding values are shown as crosses on FIG. 1. Even though this alloy contains no titanium, it presents excellent resistance to creep at medium and high temperatures.

Alloys in accordance with the invention are particularly suitable for manufacturing turbing blades for the aero industry.

The heat treatment in accordance with the invention is particularly advantageous when the alloy is intended for use in the manufacture of turbine blades.

We claim:

1. A monocrystalline super alloy with a nickel based matrix having a gamma-prime phase with a grain size of 5000 Å aligned along a well defined crystallographic direction, and particularly intended to the manufacture of turbine blades, wherein the composition, by weight, of the alloy consists essentially of:

| | |
|---|---|
| Al | 5.4 to 6.2% |
| Co | 4 to 7% |
| Cr | 6 to 9% |
| Mo | 0 to 2.5% |
| Ta | 5.5 to 8% |
| Ti | 0 to 1% |
| W | 7 to 9% | less than 80 ppm carbon, 50 ppm boron and 100 ppm zirconium
Ni balance to 100%.

2. A superalloy according to claim 1, wherein the composition by weight consists essentially of:

| | |
|---|---|
| Al | 6.1% |
| Co | 5% |
| Cr | 8% |
| Mo | 0.5% |
| Ta | 6% |
| W | 8% | less than 80 ppm carbon, 50 ppm boron and 100 ppm zirconium
Ni balance to 100%.

3. A turbine blade made from the alloy defined in claim 1.

4. A turbine blade made from the alloy defined in claim 2.

5. A method of producing a single crystal superalloy part suited for use as a blade in an aeroengine turbine which comprises the steps of:

a) forming an alloy part which consists essentially of:

| | |
|---|---|
| Al | 5.4 to 6.2% |
| Co | 4 to 7% |
| Cr | 6 to 9% |
| Mo | 0 to 2.5% |
| Ta | 5.5 to 8% |
| Ti | 0 to 1% |
| W | 7 to 9% | less than 80 ppm carbon, 50 ppm boron and 100 ppm zirconium,
Ni balance to 100%;

b) heating the alloy part formed during step a) to a temperature of 1305°–1325° for about 30 minutes to put the Ni₃Al gamma-prime phase of the alloy completely into solution;

c) cooling the alloy part in the air to ambient temperature; and d) heating the alloy part to a temperature of 1050°–1120° C. for a time period sufficient to precipitate the gamma-prime phase into a gamma phase solid solution of the alloy wherein the gamma-prime phase has a grain size of 5000 Å, and is aligned along a well-defined crystallographic direction.

6. The method defined in claim 5, step d), wherein the alloy part is maintained at said temperature for several hours.

7. The method defined in claim 5, further comprising the step of:

e) following step d), subjecting the alloy part to cooling in the air to ambient temperature followed by heat treatment to increase the proportion of its volume occupied by the gamma-prime precipitate.

8. The method defined in claim 7, wherein the supplementary heat treatment takes place at about 850° C.

9. The method defined in claim 5, wherein a surface protection treatment is applied to the alloy part while it is being maintained at the temperature for gamma-prime phase precipitation.

10. The method defined in claim 5 wherein the alloy consists essentially of:

| | |
|---|---|
| Al | 5.5% |
| Co | 5% |
| Cr | 8% |
| Mo | 0.5% |
| Ta | 6% |
| Ti | 1% |
| W | 8% | less than 80 ppm carbon, 50 ppm boron and 100 ppm zirconium,
Ni balance to 100%.

11. The superalloy part suited for use as a blade in an aeroengine turbine made by the method defined in claim 5.

12. The superalloy part suited for use as a blade in an aeroengine turbine made by the method defined in claim 10.

13. A method of producing a single crystal superalloy suited for use as a blade in an aeroengine turbine which comprises the steps of:

a) forming an alloy part which consists essentially of:

| | |
|---|---|
| Al | 5.4 to 6.2% |
| Co | 4 to 7% |

-continued

| | |
|---|---|
| Cr | 6 to 9% |
| Mo | 0 to 2.5% |
| Ta | 5.5 to 8% |
| Ti | 0 to 1% |
| W | 7 to 9% | less than 80 ppm carbon, 50 ppm boron and 100 ppm zirconium,
Ni balance to 100%;
b) heating the alloy part formed during step a) to a temperature of 1305°–1325° for about 30 minutes to put the Ni$_3$Al gamma-prime phase of the alloy completely into solution; and
c) directly adjusting the temperature of the alloy part to a temperature of 1050°–1120° C. for a period sufficient to precipitate the gamma-prime phase into a gamma phase solid solution of the alloy wherein the gamma-prime phase has a grain size of 5000 Å, and is aligned along a well-defined crystallographic direction.

14. The method defined in claim 13, step c), wherein the alloy part is maintained at said temperature for several hours.

15. The method defined in claim 13, further comprising the steps of:
a) following step c), directly adjusting the temperature of the alloy part to a temperature of about 850° C. to carry out a supplementary heat treatment.

16. The method defined in claim 13, wherein a surface protection treatment is applied to the alloy part while it is maintained at the temperature for gamma-prime phase precipitation.

17. The superalloy part suited for use as a blade in an aeroengine turbine made by the method defined in claim 13.

* * * * *